US009876501B2

(12) United States Patent
Chen et al.

(10) Patent No.: US 9,876,501 B2
(45) Date of Patent: Jan. 23, 2018

(54) SWITCHING POWER AMPLIFIER AND METHOD FOR CONTROLLING THE SWITCHING POWER AMPLIFIER

(71) Applicant: MEDIATEK INC., Hsin-Chu (TW)

(72) Inventors: Yang-Chuan Chen, Chiayi County (TW); Hsiang-Hui Chang, Miaoli County (TW)

(73) Assignee: MediaTek Inc., Hsin-Chu (TW)

( * ) Notice: Subject to any disclaimer, the term of this patent is extended or adjusted under 35 U.S.C. 154(b) by 116 days.

(21) Appl. No.: 14/267,929

(22) Filed: May 2, 2014

(65) Prior Publication Data
US 2014/0347127 A1 Nov. 27, 2014

Related U.S. Application Data

(60) Provisional application No. 61/825,630, filed on May 21, 2013.

(51) Int. Cl.
*H03F 3/217* (2006.01)
*H03K 19/0175* (2006.01)
(Continued)

(52) U.S. Cl.
CPC ..... *H03K 19/017509* (2013.01); *G01R 21/06* (2013.01); *G01R 23/00* (2013.01); *H03F 1/24* (2013.01); *H03F 3/2178* (2013.01); *H03K 19/017581* (2013.01); *H03M 1/12* (2013.01); *H04B 1/04* (2013.01); *H04B 1/0475* (2013.01); *H04L 7/0037* (2013.01); *H04L 7/0091* (2013.01); *H04L 25/028* (2013.01); *H04L 25/08* (2013.01); *H04L 27/2053* (2013.01); *H04L 27/2067* (2013.01); *H04L 27/3411* (2013.01); *H04L 27/3444* (2013.01); *H04W 24/02* (2013.01); *H03F 2203/21154* (2013.01); *H04B 2001/045* (2013.01); *H04B 2001/0408* (2013.01)

(58) Field of Classification Search
CPC .............................................. H03F 2203/21154
USPC ........................................ 330/10, 251, 207 P
See application file for complete search history.

(56) References Cited

U.S. PATENT DOCUMENTS 4,540,904 A 9/1985 Ennis et al.
4,973,904 A 11/1990 Sonnek
(Continued)

FOREIGN PATENT DOCUMENTS

CN 1808896 A 7/2006
CN 1968007 A 5/2007

OTHER PUBLICATIONS

Office Communication dated Oct. 8, 2016 for Chinese Application No. 201410215658.4.

*Primary Examiner* — Khanh V Nguyen
*Assistant Examiner* — Khiem Nguyen
(74) *Attorney, Agent, or Firm* — Wolf, Greenfield & Sacks, P.C.

(57) ABSTRACT

A switching power amplifier includes: a first transistor controlled by a first digital signal to selectively output a first output signal; a second transistor controlled by a second digital signal to selectively output a second output signal; and a control circuit arranged to generate the second digital signal according to the first digital signal and a third digital signal; wherein the first output signal and the second output signal are outputted on a common connected node of the first transistor and the second transistor.

28 Claims, 4 Drawing Sheets

(51) Int. Cl.

| | | |
|---|---|---|
| *H04L 27/34* | (2006.01) | |
| *H04B 1/04* | (2006.01) | |
| *H04W 24/02* | (2009.01) | |
| *H04L 25/02* | (2006.01) | |
| *H04L 25/08* | (2006.01) | |
| *H03M 1/12* | (2006.01) | |
| *H04L 7/00* | (2006.01) | |
| *G01R 21/06* | (2006.01) | |
| *G01R 23/00* | (2006.01) | |
| *H03F 1/24* | (2006.01) | |
| *H04L 27/20* | (2006.01) | |

(56) References Cited

U.S. PATENT DOCUMENTS

| | | |
|---|---|---|
| 5,027,012 A | 6/1991 | Saeki et al. |
| 5,087,840 A | 2/1992 | Davies et al. |
| 5,140,180 A | 8/1992 | Crafts et al. |
| 5,212,740 A | 5/1993 | Paek et al. |
| 5,382,915 A * | 1/1995 | Muri ............. H03F 3/2171 330/10 |
| 5,572,535 A | 11/1996 | Pixley et al. |
| RE36,655 E | 4/2000 | Kozaru et al. |
| 6,294,957 B1 | 9/2001 | Luu |
| 6,346,828 B1 | 2/2002 | Rosen et al. |
| 6,549,471 B1 | 4/2003 | Zivanovic |
| 6,642,749 B1 | 11/2003 | Wu et al. |
| 7,330,069 B2 * | 2/2008 | Yamamura ........... H03F 1/26 330/10 |
| 7,532,538 B2 | 5/2009 | Choi et al. |
| 7,843,234 B2 | 11/2010 | Srinivas et al. |
| 7,863,933 B2 | 1/2011 | Chuang |
| 7,932,762 B2 | 4/2011 | Turner et al. |
| 8,345,500 B2 | 1/2013 | Wang et al. |
| 2002/0159300 A1 | 10/2002 | Fujimoto |
| 2007/0236286 A1 | 10/2007 | Kobayashi et al. |
| 2010/0109773 A1* | 5/2010 | Takagi ............... H03F 3/217 330/251 |

* cited by examiner

Truth Table 300

| D[1]+ | D[1]- | P_type FET 204 | N_type FET 202 | P_type FET 214 | N_type FET 212 | N1/N2 |
|---|---|---|---|---|---|---|
| 0 | 0 | 1 | 0 | 1 | 0 | High impedance |
| 0 | 1 | 0 | 0 | 1 | 1 | Data− |
| 1 | 0 | 1 | 1 | 0 | 0 | Data+ |
| 1 | 1 | N/A | N/A | N/A | N/A | N/A |

FIG. 3

SWITCHING POWER AMPLIFIER AND METHOD FOR CONTROLLING THE SWITCHING POWER AMPLIFIER

CROSS REFERENCE TO RELATED APPLICATIONS

This application claims the benefit of US Provisional Application No. 61/825,630, which was filed on 2013 May 21 and is included herein by reference.

BACKGROUND

The present invention relates to a switching power amplifier and a method for controlling the switching power amplifier, and more particularly to a high efficiency digital power amplifying device, and the related controlling method.

In wireless communication system, such as the third generation (3G) mobile communication system, a high dynamic range of power is required. For example, a cellular may be required to output power with dynamic range of 78 dB. Normally, an on-chip transmitter capable of generating power range from 0 dBm to −78 dBm may comprise various components, such as digital-to-analog converter (DAC), low pass filter, programmable gain amplifier, modulator, and pre-driver, and those components are complicated and may occupy a large area of the transmitter. Therefore, replacing the transmitter by an RF power DAC, such as a digital transmitter using switch-mode power amplifier, may relax the hardware complexity. However, the digital transmitter may suffer from the problem of leakage power. More specifically, a switch-mode power amplifier may comprise a plurality of power amplifier cells, and each is arranged to amplify one bit among a plurality of inputting bits. If a first power amplifier cell is outputting a high voltage signal and a second power amplifier cell is outputting a low voltage signal, then a leakage current may be induced to flow to the second power amplifier cell from the first power amplifier cell. This phenomenon may cause a power loss to the switch-mode power amplifier. Therefore, how to avoid the power loss of a switch-mode power amplifier is an urgent problem in the wireless communication system.

SUMMARY

One objective of the present embodiment is to provide a high efficiency digital power amplifying device, and the related controlling method.

According to a first embodiment of the present invention, a switching power amplifier is disclosed. The switching power amplifier comprises a first transistor, a second transistor, and a control circuit. The first transistor is controlled by a first digital signal to selectively output a first output signal. The second transistor is controlled by a second digital signal to selectively output a second output signal. The control circuit is arranged to generate the second digital signal according to the first digital signal and a third digital signal; wherein the first output signal and the second output signal are outputted on a common connected node of the first transistor and the second transistor.

According to a second embodiment of the present invention, a method for controlling a switching power amplifier is disclosed, wherein the switching power amplifier comprises a first transistor and a second transistor. The method comprises the steps: controlling the first transistor to selectively output a first output signal by a first digital signal; controlling the second transistor to selectively output a second output signal by a second digital signal; and generating the second digital signal according to the first digital signal and a third digital signal; wherein the first output signal and the second output signal are outputted on a common connected node of the first transistor and the second transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating a truth table to show the on/off of a P-type FET, an N-type FET, the other P-type FET, the other N-type FET, and a signal on the output terminals corresponding to the values of a positive data bit and a negative data bit according to an embodiment of the present invention.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
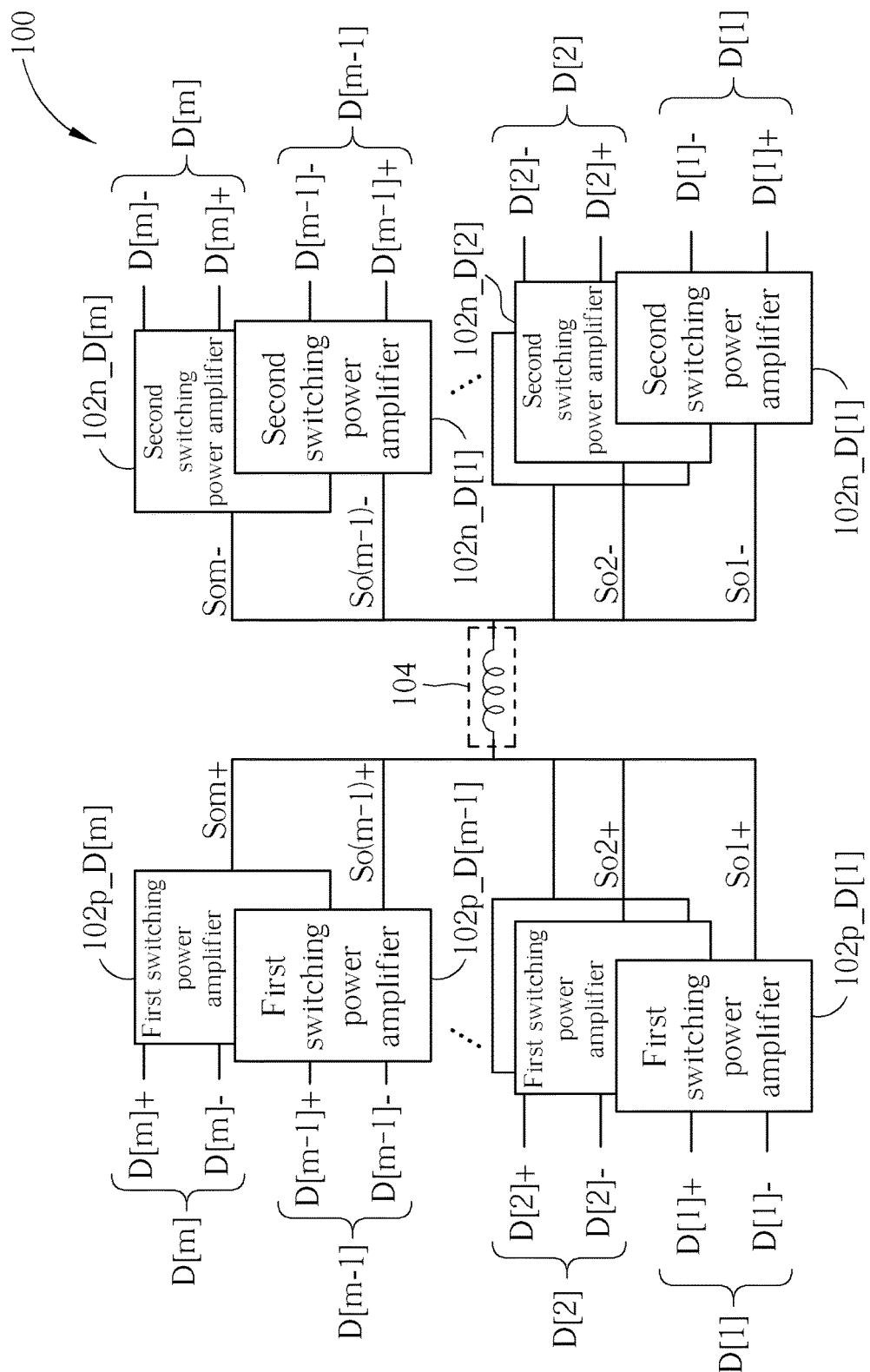
FIG. 1 is a diagram illustrating a digital power amplifying device according to an embodiment of the present invention.

Please refer to FIG. 1, which is a diagram illustrating a digital power amplifying device 100 according to an embodiment of the present invention. The digital power amplifying device 100 is arranged to power up a digital signal (i.e. a plurality of differential data bits D[1]~D[m]) into an output signal Sout. The digital power amplifying device 100 comprises a plurality of first switching power amplifiers 102p_D[1]~102p_D[m], a plurality of second switching power amplifiers 102n_D[1]~102n_D[n], and an inductive device 104, wherein the plurality of first switching power amplifiers 102p_D[1]~102p_D[m] corresponds to plurality of second switching power amplifiers 102n_D[1]~102n_D[n] respectively. More specifically, the first switching power amplifier 102p_D[1] and the second switching power amplifier 102n_D[1] are arranged to receive a first differential data bit D[1] of the plurality of differential data bits D[1]~D[m], the second switching power amplifier 102p_D[2] and the second switching power amplifier 102n_D[2] are arranged to receive a second differential data bit D[2] of the plurality of differential data bits D[1]~D[m], and so on. It is noted that a differential data bit D[m] comprises a positive data bit D[m]+ and a negative data bit D[m]−.

According to the present embodiment, the first switching power amplifier 102p_D[1] generates a first positive output signal So1+ according to the first differential data bit D[1] (i.e. D[1]+ and D[1]−) meanwhile the second switching power amplifier 102n_D[1] generates a first negative output signal So1− according to the first differential data bit D[1] (i.e. D[1]+ and D[1]−). The first switching power amplifier 102p_D[2] generates a second positive output signal So2+ according to the second differential data bit D[2] (i.e. D[2]+ and D[2]−) meanwhile the second switching power amplifier 102n_D[2] generates a second negative output signal So2− according to the second differential data bit D[2] (i.e. D[2]+ and D[2]−). Similarly, the first switching power amplifier 102p_D[m] generates an m-th positive output signal Som+ according to the m-th differential data bit D[m] (i.e. D[m]+ and D[m]−) meanwhile the second switching power amplifier 102n_D[m] generates an m-th negative output signal Som− according to the m-th differential data bit D[m] (i.e. D[m]+ and D[m]−). Then, the inductive device 104 is arranged to generate the output signal Sout according to the plurality of positive output signal So1+~Som+ and the plurality of negative output signal So1−~Som−.

It should be noted that, when the digital power amplifying device 100 is under operation, the whole plurality of differential data bits D[1]~D[m] may not always be the differential signals. Depending on the predetermined output power of the output signal Sout, some of the data bits in the plurality of differential data bits D[1]~D[m] may convey input data (i.e. the differential data bits) and some of the data bits in the plurality of differential data bits D[1]~D[m] may not convey input data (i.e. not the differential data bit). According to the embodiment, if there is no input data inputting to a switching power amplifier, both the positive data bit and the negative bit of the differential data bits are the low voltage level, i.e. both the positive data bit and the negative bit are 0. Take the first switching power amplifier 102p_D[1] as an example, if the first differential data bit D[1] conveying no input data, then the voltage levels of both the positive data bit D[1]+ and the negative bit D[1]− are 0.

In addition, according to the embodiment, when the digital power amplifying device 100 is under operation, if some or all of the first switching power amplifiers 102p_D[1]~102p_D[m] are used for sourcing currents to the inductive device 104, then the corresponding second switching power amplifiers in the plurality of second switching power amplifiers 102n_D[1]~102n_D[n] are used for sinking the corresponding currents from the inductive device 104, and vice versa. In other words, when the positive side (i.e. the first switching power amplifiers 102p_D[1]~102p_D[m]) of the digital power amplifying device 100 used to source currents to the inductive device 104, then the negative side (i.e. the second switching power amplifiers 102n_D[1]~102n_D[m]) of the digital power amplifying device 100 must be used to sink the currents from the inductive device 104, and vice versa. For example, if the first switching power amplifiers 102p_D[1] and 102p_D[m] are used to source currents (i.e. So1+ and Som+) to the inductive device 104 and the other first switching power amplifiers 102p_D[2]~102p_D[m−1] are turned off, then the corresponding second switching power amplifiers 102n_D[1] and 102n_D[m] must be used to sink currents (i.e. So1− and Som−) from the inductive device 104 and the other second switching power amplifiers 102n_D[2]~102n_D[m−1] are also turned off.

Figure 2:
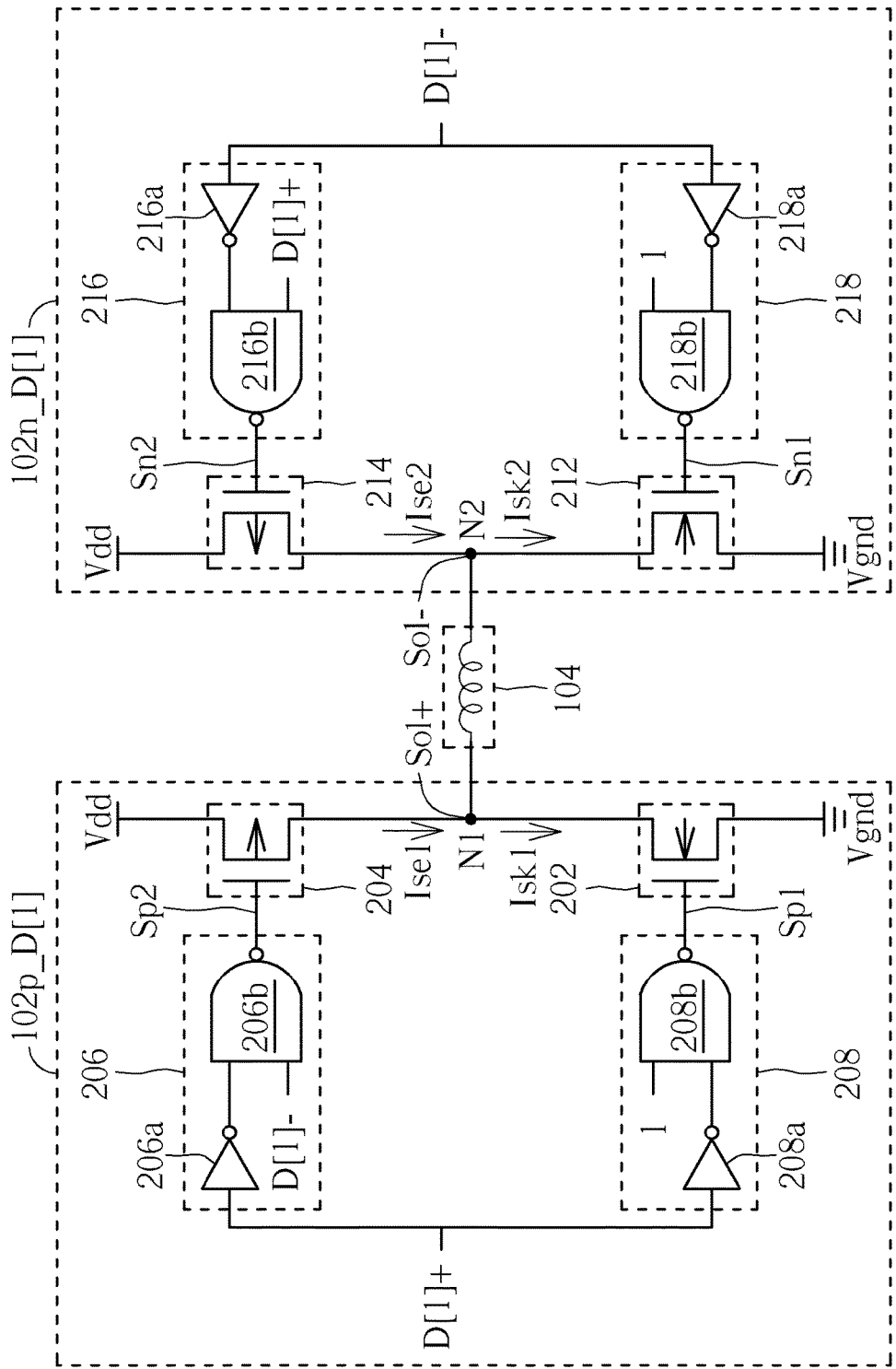
FIG. 2 is a diagram illustrating a pair of switching power amplifiers according to an embodiment of the present invention.

Please refer to FIG. 2, which is a diagram illustrating a pair of switching power amplifiers (e.g. the first switching power amplifier 102p_D[1] and the second switching power amplifier 102n_D[1]) according to an embodiment of the present invention. For illustrative purpose, the inductive device 104 is also shown in FIG. 2. The first switching power amplifier 102p_D[1] comprises an N-type field-effected transistor (FET) 202, a P-type FET 204, a control circuit 206, and a delay circuit 208. The N-type FET 202 has a gate terminal to receive a delayed first digital signal Sp1, a source terminal coupled to the ground voltage Vgnd, and a drain terminal coupled to a first terminal N1 of the inductive device 104. The P-type FET 204 has a gate terminal to receive a second digital signal Sp2, a source terminal coupled to the supply voltage Vdd, and a drain terminal coupled to the first terminal N1 of the inductive device 104. The N-type FET 202 is arranged to selectively generate a first output signal (i.e. sinking a current Isk1 from the inductive device 104) to generate the first positive output signal So1+ according to the delayed first digital signal Sp1, or the P-type FET 204 is arranged to selectively generate a second output signal (i.e. sourcing a current Ise1 to the inductive device 104) according to the second digital signal Sp2, or the N-type FET 202 and the P-type FET 204 are turned off by the delayed first digital signal Sp1 and second digital signal Sp2 respectively. The drain terminal of the N-type FET 202 and the drain terminal of the P-type FET 204 are the common connected node of the N-type FET 202 and the P-type FET 204.

The control circuit 206 comprises an inverter 206a and a NAND gate 206b. The inverter 206a is arranged to generate an inverted first digital signal D[1]+_bar according to the positive data bit D[1]+ of the first differential data bit D[1]. The positive data bit D[1]+ of the first differential data bit D[1] can be regarded as the first digital signal. The NAND gate 206b is arranged to generate the second digital signal Sp2 according to the inverted first digital signal D[1]+_bar and the negative data bit D[1]− of the first differential data bit D[1].

The delay circuit 208 is arranged to generate the delayed first digital signal Sp1 according to the positive data bit D[1]+ of the first differential data bit D[1]. The delay circuit 208 comprises an inverter 208a and a NAND gate 208b. The inverter 208a is arranged to generate another inverted first digital signal D[1]+_bar1 according to the positive data bit D[1]+ of the first differential data bit D[1]. The NAND gate 208b is arranged to generate the delayed first digital signal Sp1 according to the inverted first digital signal D[1]+_bar1 and a high level voltage (e.g. data 1).

On the other hand, the second switching power amplifier 102n_D[1] comprises an N-type field-effected transistor (FET) 212, a P-type FET 214, a control circuit 216, and a delay circuit 218. The N-type FET 212 has a gate terminal to receive a delayed first digital signal Sn1, a source terminal coupled to the ground voltage Vgnd, and a drain terminal coupled to a second terminal N2 of the inductive device 104. The P-type FET 214 has a gate terminal to receive a second digital signal Sn2, a source terminal coupled to the supply voltage Vdd, and a drain terminal coupled to the second terminal N2 of the inductive device 104. The N-type FET 212 is arranged to selectively generate a first output signal (i.e. sinking a current Isk2 from the inductive device 104) to generate the first negative output signal So1− according to the delayed first digital signal Sn1, or the P-type FET 214 is arranged to selectively generate a second output signal (i.e. sourcing a current Ise2 to the inductive device 104) according to the second digital signal Sn2, or the N-type FET 212 and the P-type FET 214 are turned off by the delayed first digital signal Sn1 and second digital signal Sn2 respectively. The drain terminal of the N-type FET 212 and the drain terminal of the P-type FET 214 are the common connected node of the N-type FET 212 and the P-type FET 214.

The control circuit 216 comprises an inverter 216a and a NAND gate 216b. The inverter 216a is arranged to generate an inverted first digital signal D[1]−_bar according to the negative data bit D[1]− of the first differential data bit D[1]. The negative data bit D[1]− of the first differential data bit D[1] can be regarded as the first digital signal. The NAND gate 216b is arranged to generate the second digital signal Sn2 according to the inverted first digital signal D[1]−_bar and the positive data bit D[1]+ of the first differential data bit D[1].

The delay circuit 218 is arranged to generate the delayed first digital signal Sn1 according to the negative data bit D[1]− of the first differential data bit D[1]. The delay circuit 218 comprises an inverter 218a and a NAND gate 218b. The inverter 218a is arranged to generate another inverted first digital signal D[1]−_bar1 according to the negative data bit D[1]− of the first differential data bit D[1]. The NAND gate 218b is arranged to generate the delayed first digital signal Sn1 according to the inverted first digital signal D[1]−_bar1 and a high level voltage (e.g. data 1).

According to the embodiment, the operation of the first switching power amplifier 102p_D[1] and the second switching power amplifier 102n_D[1] can be summarized into the truth table as shown in FIG. 3. FIG. 3 is a diagram illustrating a truth table 300 to show the on/off of the P-type FET 204, the N-type FET 202, the P-type FET 214, the N-type FET 212, and the signal on the terminal N1/N2 corresponding to the values of the positive data bit D[1]+ and the negative data bit D[1]− according to an embodiment of the present invention. According to the first row 302 of the truth table 300, the values of the positive data bit D[1]+ and the negative data bit D[1]− are both 0 (i.e. the low voltage level), which means that the first differential data bit D[1] conveys no input data. Therefore, the second digital signal Sp2 inputting to the gate of the P-type FET 204 is 1 (i.e. the high voltage level) to turn off the P-type FET 204, and the delayed first digital signal Sp1 inputting to the gate of the N-type FET 202 is 0 (i.e. the low voltage level) to turn off the N-type FET 202. Meanwhile, the second digital signal Sn2 inputting to the gate of the P-type FET 214 is also 1 (i.e. the high voltage level) to turn off the P-type FET 214, and the delayed first digital signal Sn1 inputting to the gate of the N-type FET 212 is also 0 (i.e. the low voltage level) to turn off the N-type FET 212. When the P-type FET 204, the N-type FET 202, the P-type FET 214, and the N-type FET 212 are all turned off, the impedance on the terminal N1 or N2 are high impedance, i.e. the currents Ise1, Ise2, Isk1, Isk2 are all zero. Therefore, no leakage current would be flowed into the drain terminals of the P-type FET 204, the N-type FET 202, the P-type FET 214, and the N-type FET 212.

According to the second row 304 of the truth table 300, the value of the positive data bit D[1]+ is 0 and the value of the negative data bit D[1]− is 1, which means that the first differential data bit D[1] conveys input data. Therefore, the second digital signal Sp2 inputting to the gate of the P-type FET 204 is 0 to turn on the P-type FET 204, and the delayed first digital signal Sp1 inputting to the gate of the N-type FET 202 is 1 to turn off the N-type FET 202. Meanwhile, the second digital signal Sn2 inputting to the gate of the P-type FET 214 is 1 to turn off the P-type FET 214, and the delayed first digital signal Sn1 inputting to the gate of the N-type FET 212 is 1 to turn on the N-type FET 212. When the P-type FET 204 and the N-type FET 212 are turned on, and the N-type FET 202 and the P-type FET 214 are turned off, the current Ise1 and the current Isk2 are induced to flow through the P-type FET 204 and the N-type FET 212 respectively. Accordingly, an amplified signal Data− (i.e. So1+, So1−) is generated on the inductive device 104.

According to the second row 306 of the truth table 300, the value of the positive data bit D[1]+ is 1 and the value of the negative data bit D[1]− is 0, which means that the first differential data bit D[1] conveys input data. Therefore, the second digital signal Sp2 inputting to the gate of the P-type FET 204 is 1 to turn off the P-type FET 204, and the delayed first digital signal Sp1 inputting to the gate of the N-type FET 202 is 1 to turn on the N-type FET 202. Meanwhile, the second digital signal Sn2 inputting to the gate of the P-type FET 214 is 0 to turn on the P-type FET 214, and the delayed first digital signal Sn1 inputting to the gate of the N-type FET 212 is 0 to turn off the N-type FET 212. When the P-type FET 204 and the N-type FET 212 are turned off, and the N-type FET 202 and the P-type FET 214 are turned on, the current Ise2 and the current Isk1 are induced to flow through the P-type FET 214 and the N-type FET 202 respectively.

Accordingly, an amplified signal Data+ (i.e. So1+, So1−) is generated on the inductive device 104.

It should be noted that both the values of the positive data bit D[1]+ and the negative data bit D[1]− will never be 1 at the same time in this embodiment as shown in the row 308 of the truth table 300.

Moreover, according to the embodiment, the delay circuit 208 is arranged to provide substantially the same delay to the control circuit 206 such that the delayed first digital signal Sp1 and the second digital signal Sp2 can reach the N-type FET 202 and the P-type FET 204 respectively at the same time. Similarly, the delay circuit 218 is arranged to provide substantially the same delay to the control circuit 216 such that the delayed first digital signal Sn1 and the second digital signal Sn2 can reach the N-type FET 212 and the P-type FET 214 respectively at the same time. Therefore, the configurations of the delay circuits 208 and 218 are similar to the control circuits 206 and 216 respectively. The delay circuits 208 and 218 are also the optional device for the first switching power amplifier 102p_D[1] and the second switching power amplifier 102n_D[1] respectively.

Accordingly, when both the values of the positive data bit D[1]+ and the negative data bit D[1]− are both 0, the P-type FET 204, the N-type FET 202, the P-type FET 214, and the N-type FET 212 are all turned off to reduce/eliminate the leakage currents. When the positive data bit D[1]+ and the negative data bit D[1]− are differential data, the first switching power amplifier 102p_D[1] and the second switching power amplifier 102n_D[1] are operated to amplify the differential data to generate the amplified signal Data− (i.e. So1+, So1−). Therefore, the first switching power amplifier 102p_D[1] and the second switching power amplifier 102n_D[1] are data dependent tri-state amplifiers, i.e. (D[1]+, D[1]−)=(0,0), (D[1]+, D[1]−)=(1,0), and (D[1]+, D[1]−)=(0,1).

It should be noted that although only the first switching power amplifier 102p_D[1] and the second switching power amplifier 102n_D[1] are shown in FIG. 2, other pair of switching power amplifiers (i.e. 102p_D[2]~102p_D[m] and 102n_D[2]~102n_D[m]) also have the similar characteristic. Moreover, although the feature of the embodiment is illustrated in the form of differential pairs, those skilled in the art are appreciated to understand the similar idea can also be applied in the single ended switch power amplifier. Thus, the detailed description is omitted here for brevity.

Moreover, the present invention is not limited to the architecture of the control circuits 206 and 216, any other logical combinations having the similar characteristic are within the scope of the present invention.

Figure 4:
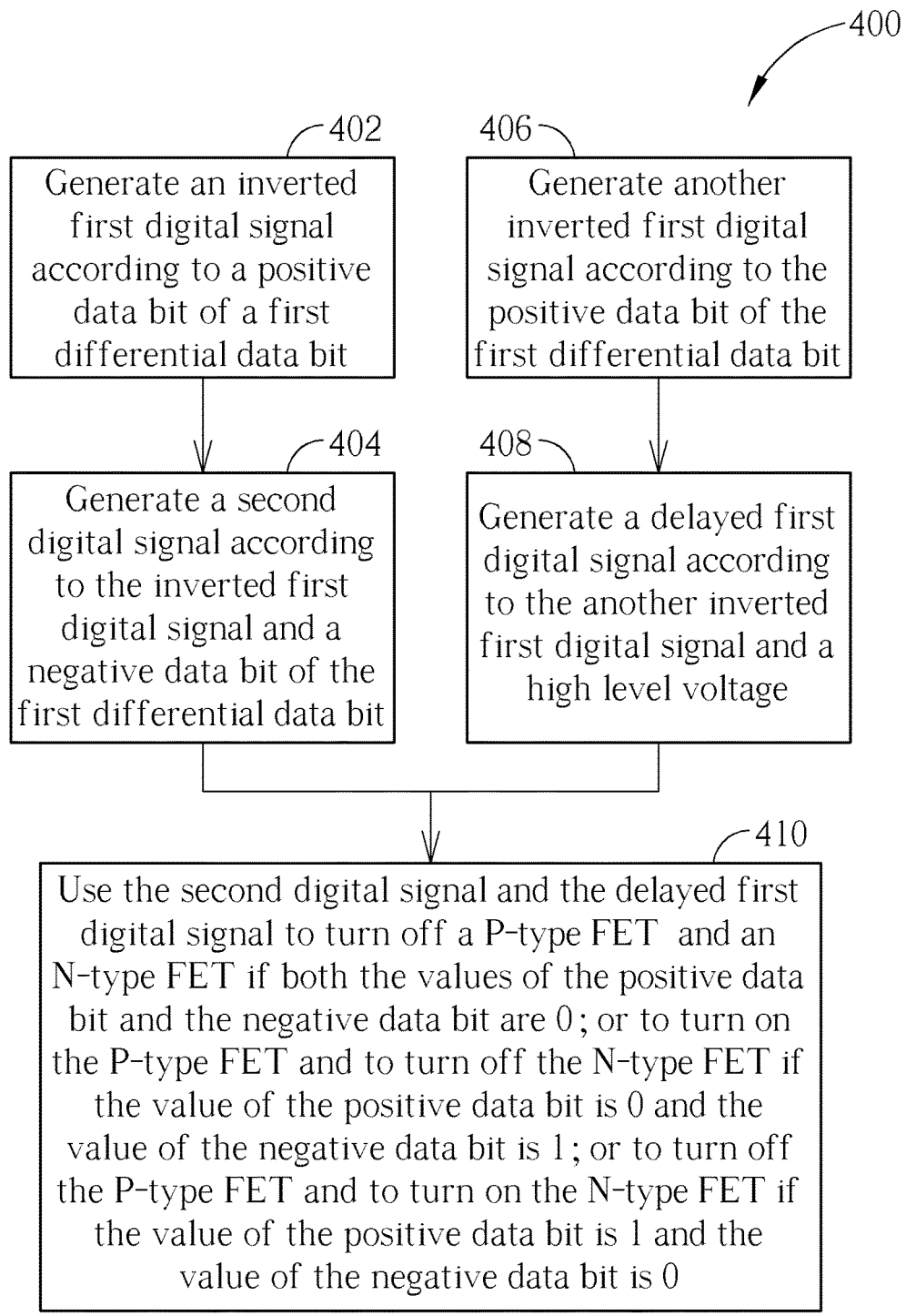
FIG. 4 is a flowchart illustrating a method for controlling a first switching power amplifier according to an embodiment of the present invention.

In summary, the method of the above mentioned switching power amplifier (e.g. the first switching power amplifier 102p_D[1]) as shown in FIG. 2 can be summarized into the steps of FIG. 4. FIG. 4 is a flowchart illustrating a method 400 for controlling the first switching power amplifier 102p_D[1] according to an embodiment of the present invention. Provided that substantially the same result is achieved, the steps of the flowchart shown in FIG. 4 need not be in the exact order shown and need not be contiguous, that is, other steps can be intermediate. The data converting method 400 comprises:

Step 402: Use the inverter 206a to generate the inverted first digital signal D[1]+_bar according to the positive data bit D[1]+ of the first differential data bit D[1];

Step 404: Use the NAND gate 206b to generate the second digital signal Sp2 according to the inverted first digital signal D[1]+_bar and the negative data bit D[1]− of the first differential data bit D[1], go to step 410;

Step 406: Use the inverter 208a to generate the another inverted first digital signal D[1]+_bar1 according to the positive data bit D[1]+ of the first differential data bit D[1];

Step 408: Use the NAND gate 208b to generate the delayed first digital signal Sp1 according to the another inverted first digital signal D[1]+_bar1 and the high level voltage, go to step 410; and Step 410: Use the second digital signal Sp2 and the delayed first digital signal Sp1 to turnoff the P-type FET 204 and the N-type FET 202 if both the values of the positive data bit D[1]+ and the negative data bit D[1]− are 0; or use the second digital signal Sp2 to turn on the P-type FET 204 and use the delayed first digital signal Sp1 to turn off the N-type FET 202 if the value of the positive data bit D[1]+ is 0 and the value of the negative data bit D[1]− is 1; or use the second digital signal Sp2 to turn off the P-type FET 204 and use the delayed first digital signal Sp1 to turn on the N-type FET 202 if the value of the positive data bit D[1]+ is 1 and the value of the negative data bit D[1]− is 0.

Briefly, as illustrated in the above embodiments, the present switching power amplifier is a data dependent tri-state amplifier. When both the values of the positive data bit and the negative data bit are both 0, the switching power amplifier is turned off to make the output terminal to have a high impedance. When the positive data bit and the negative data bit are differential data, the switching power amplifier is operated to amplify the differential data to generate the amplified signal. By switching off the switching power amplifier when both the values of the positive data bit and the negative data bit are both 0, the leakage current can be eliminated. Therefore the present digital power amplifying device is a high efficiency digital power amplifying device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switching power amplifier, comprising:
a first transistor, controlled by a first digital signal to selectively output a first output signal;
a second transistor, controlled by a second digital signal to selectively output a second output signal; and
a control circuit, arranged to generate the second digital signal according to the first digital signal and a third digital signal, the control circuit comprising an inverter that inverts the first digital signal, wherein a state of the first transistor is independent of the third digital signal;
wherein the first output signal and the second output signal are outputted on a common connected node of the first transistor and the second transistor, and the first digital signal and the third digital signal are a differential pair.

2. The switching power amplifier of claim 1, wherein when the first digital signal and the third digital signal are a first voltage level, the control circuit generates the second digital signal to control the second transistor not to output the second output signal.

3. The switch power amplifier of claim 2, wherein the first voltage level is a low voltage level.

4. The switching power amplifier of claim 1, wherein when the first digital signal is a first voltage level and the third digital signal is a second voltage level different from the first voltage level, the control circuit generates the second digital signal to control the second transistor to output the second output signal.

5. The switching power amplifier of claim 4, wherein first voltage level is a low voltage level and the second voltage level is a high voltage level.

6. The switching power amplifier of claim 1, wherein when the third digital signal is a first voltage level and the first digital signal is a second voltage level different from the first voltage level, the control circuit generates the second digital signal to control the second transistor not to output the second output signal.

7. The switching power amplifier of claim 6, wherein the first voltage level is a low voltage level and the second voltage level is a high voltage level.

8. The switching power amplifier of claim 1, wherein the control circuit further comprises
a NAND gate, arranged to generate the second digital signal according to an inverted first digital signal produced by the inverter and the third digital signal.

9. The switching power amplifier of claim 1, further comprising:
a delay circuit, arranged to generate a delayed first digital signal according to the first digital signal;
wherein the first transistor is controlled by the delayed first digital signal to selectively output the first output signal.

10. The switching power amplifier of claim 9, wherein the delay circuit comprises:
a second inverter, arranged to generate an inverted first digital signal according to the first digital signal; and
a NAND gate, arranged to generate the delayed first digital signal according to the inverted first digital signal and a high voltage level.

11. A method for controlling a switching power amplifier, wherein the switching power amplifier comprises a first transistor and a second transistor, and the method comprises:
controlling the first transistor to selectively output a first output signal by a first digital signal;
controlling the second transistor to selectively output a second output signal by a second digital signal; and
generating the second digital signal according to an inverted version of the first digital signal and a third digital signal, wherein a state of the first transistor is independent of the third digital signal;

wherein the first output signal and the second output signal are outputted on a common connected node of the first transistor and the second transistor, and the first digital signal and the third digital signal are a differential pair.

12. The method of claim 11, wherein when the first digital signal and the third digital signal are a first voltage level, the second digital signal controls the second transistor not to output the second output signal.

13. The method of claim 12, wherein the first voltage level is a low voltage level.

14. The method of claim 11, wherein when the first digital signal is a first voltage level and the third digital signal is a second voltage level different from the first voltage level, the second digital signal controls the second transistor to output the second output signal.

15. The method of claim 14, wherein the first voltage level is a low voltage level and the second voltage level is a high voltage level.

16. The method of claim 11, wherein when the third digital signal is a first voltage and the first digital signal is a second voltage level different from the first voltage level, the second digital signal controls the second transistor not to output the second output signal.

17. The method of claim 16, wherein the first voltage level is a low voltage level and the second voltage level is a high voltage level.

18. The method of claim 11, wherein the step of generating the second digital signal according to the inverted version of the first digital signal and the third digital signal comprises:
  using an inverter to generate the inverted version of the first digital signal according to the first digital signal; and
  using a NAND gate to generate the second digital signal according to the inverted version of the first digital signal and the third digital signal.

19. The method of claim 11, further comprising:
  generating a delayed first digital signal according to the first digital signal;
  wherein the first transistor is controlled by the delayed first digital signal to selectively output the first output signal.

20. The method of claim 19, wherein the step of generating the delayed first digital signal according to the first digital signal comprises:
  using an inverter to generate an inverted version of the first digital signal according to the first digital signal; and
  using a NAND gate to generate the delayed first digital signal according to the inverted version of the first digital signal and a high voltage level.

21. A digital power amplifying device, comprising:
  a first switching power amplifier, comprising:
    a first transistor, controlled by a first digital signal to selectively output a first output signal;
    a second transistor, controlled by a second digital signal to selectively output a second output signal; and
    a first control circuit, arranged to generate the second digital signal according to the first digital signal and a third digital signal;
  wherein the first output signal and the second output signal are outputted on a common connected node of the first transistor and the second transistor;
  a second switching power amplifier, comprising:
    a third transistor, controlled by a fourth digital signal to selectively output a third output signal;
    a fourth transistor, controlled by a fifth digital signal to selectively output a fourth output signal; and
    a second control circuit, arranged to generate the fifth digital signal according to the fourth digital signal and a sixth digital signal,
  wherein the third output signal and the fourth output signal are outputted on a common connected node of the first transistor and the second transistor, and
  wherein the first digital signal and the fourth digital signal are a differential pair.

22. The digital power amplifying device of claim 21, wherein the differential pair provide a differential data bit.

23. The digital power amplifying device of claim 21, further comprising:
  a delay circuit, arranged to generate a delayed first digital signal according to the first digital signal,
  wherein the first transistor is controlled by the delayed first digital signal to selectively output the first output signal.

24. The digital power amplifying device of claim 23, wherein the delay circuit comprises:
  an inverter, arranged to generate an inverted first digital signal according to the first digital signal; and
  a NAND gate, arranged to generate the delayed first digital signal according to the inverted first digital signal and a high voltage level.

25. The digital power amplifying device of claim 21, wherein the third digital signal is the fourth digital signal, and the sixth digital signal is the first digital signal.

26. The digital power amplifying device of claim 21, further comprising an inductive device coupled between the first switching power amplifier and the second switching power amplifier.

27. A switching power amplifier, comprising:
  a first transistor, controlled by a first digital signal to selectively output a first output signal;
  a second transistor, controlled by a second digital signal to selectively output a second output signal; and
  a control circuit, arranged to generate the second digital signal according to the first digital signal and a third digital signal, wherein a state of the first transistor is independent of the third digital signal, and the first digital signal and the third digital signal are a differential pair,
  wherein the first output signal and the second output signal are outputted on a common connected node of the first transistor and the second transistor,
  wherein the switching power amplifier further comprises a delay circuit, arranged to generate a delayed first digital signal according to the first digital signal,
  wherein the first transistor is controlled by the delayed first digital signal to selectively output the first output signal, and
  wherein the delay circuit comprises:
    an inverter, arranged to generate an inverted first digital signal according to the first digital signal; and
    a NAND gate, arranged to generate the delayed first digital signal according to the inverted first digital signal and a high voltage level.

28. A method for controlling a switching power amplifier, wherein the switching power amplifier comprises a first transistor and a second transistor, and the method comprises:
  controlling the first transistor to selectively output a first output signal by a first digital signal;
  controlling the second transistor to selectively output a second output signal by a second digital signal; and generating the second digital signal according to the first digital signal and a third digital signal, wherein a state of the first transistor is independent of the third digital signal, and the first digital signal and the third digital signal are a differential pair, wherein the first output signal and the second output signal are outputted on a common connected node of the first transistor and the second transistor, wherein the method further comprises:

generating a delayed first digital signal according to the first digital signal, wherein the first transistor is controlled by the delayed first digital signal to selectively output the first output signal, wherein the step of generating the delayed first digital signal according to the first digital signal comprises:
  using an inverter to generate an inverted first digital signal according to the first digital signal; and
  using a NAND gate to generate the delayed first digital signal according to the inverted first digital signal and a high voltage level.

* * * * *

UNITED STATES PATENT AND TRADEMARK OFFICE
CERTIFICATE OF CORRECTION

PATENT NO.        : 9,876,501 B2
APPLICATION NO.   : 14/267929
DATED             : January 23, 2018
INVENTOR(S)       : Yang-Chuan Chen et al.

Page 1 of 1

It is certified that error appears in the above-identified patent and that said Letters Patent is hereby corrected as shown below:

In the Claims

Column 8, Claim 1, Lines 11 and 12, which state "the third digital signal are a differential pair" are corrected to read as ---the third digital signal are differential signals---.

Column 9, Claim 11, Lines 4 and 5, which state "the third digital signal are a differential pair" are corrected to read as ---the third digital signal are differential signals---.

Column 10, Claim 21, Lines 9 and 10, which state "the fourth digital signal are a differential pair" are corrected to read as ---the fourth digital signal are differential signals---.

Column 10, Claim 22, Line 12, which states ""the differential pair" is corrected to read as ---the differential signals---.

Column 10, Claim 27, Lines 44 and 45, which state "the third digital signal are a differential pair" are corrected to read as ---the third digital signal are differential signals---.

Column 11, Claim 28, Lines 4 and 5, which state "the third digital signal are a differential pair" are corrected to read as ---the third digital signal are differential signals---.

Signed and Sealed this
First Day of May, 2018

Andrei Iancu
*Director of the United States Patent and Trademark Office*